United States Patent [19]

Nakayama et al.

[11] Patent Number: 4,868,096

[45] Date of Patent: Sep. 19, 1989

[54] SURFACE TREATMENT OF SILICONE-BASED COATING FILMS

[75] Inventors: Muneo Nakayama, Tokyo; Akira Uehara, Kanagawa; Akira Hashimoto, Kanagawa; Toshihiro Nishimura, Kanagawa; Isamu Hijikata, Kanagawa; Mitsuaki Minato, Kanagawa; Eiichi Kashiwagi, Kanagawa, all of Japan

[73] Assignee: Tokyo Ohka Kogyo Co., Ltd., Tokyo, Japan

[21] Appl. No.: 92,485

[22] Filed: Sep. 3, 1987

[30] Foreign Application Priority Data

Sep. 9, 1986 [JP] Japan .................................. 61-210598
Sep. 9, 1986 [JP] Japan .................................. 61-210599

[51] Int. Cl.$^4$ ............................................... G03C 5/00
[52] U.S. Cl. ..................................... 430/329; 430/386; 427/38; 427/40
[58] Field of Search ................ 430/323, 325, 326, 329, 430/330; 427/34, 35, 40, 41, 38, 39

[56] References Cited

U.S. PATENT DOCUMENTS

| | | | |
|---|---|---|---|
| 4,292,384 | 9/1981 | Straughan et al. | 430/5 |
| 4,368,092 | 1/1983 | Steinberg et al. | 156/345 |
| 4,430,153 | 2/1984 | Gleason et al. | 156/643 |
| 4,723,978 | 2/1988 | Clodgo et al. | 65/31 |

OTHER PUBLICATIONS

Butherus et al, "O$_2$ Plasma–Converted SOG for Planarization," J. Vac. Sci. Technol. B3(5), Sep./Oct. 1985, pp. 1352–1356.

*Primary Examiner*—Jose G. Dees
*Attorney, Agent, or Firm*—Pennie & Edmonds

[57] ABSTRACT

The adhesiveness of a silicone-based coating film on a substrate to an overcoating layer, e.g., a photoresist layer, can be improved without causing cracks when the silicone-based coating film is subjected to a plasma treatment at a temperature of 120° C. or below in an atmosphere of a gas mainly composed of oxygen. Similar conditions of plasma treatment are applicable when patterning of a silicone-based coating film is desired in a procedure comprising the steps of forming a photoresist layer thereon, patterning of the photoresist layer in a photolithographic method, selectively etching the silicone-based coating film with the patterned resist layer serving as a mask and removing the photoresist layer by the plasma treatment.

10 Claims, No Drawings

SURFACE TREATMENT OF SILICONE-BASED COATING FILMS

TECHNICAL FIELD

The present invention relates to a method for the surface treatment of a silicone-based coating film or, more particularly, to a method for the surface treatment of a coating film of a silicone useful as an electronic material to form a uniform coating film free from cracks along with improvement of the adhesiveness of the surface. Thus, the present invention also relates to a method for the patterning of a silicone-based coating film or, more particularly, to a method for uniformly patterning a silicone-based coating film without forming cracks.

BACKGROUND OF THE INVENTION

Before an organic or inorganic coating film is overcoated with another coating film, the adhesiveness of the surface of the coating film must be improved. Various techniques have been utilized for this purpose, including roughening of the surface using sandpaper or by a honing treatment, along with activating the surface by a plasma or corona discharge treatment or by irradiation with ultraviolet light.

Among many kinds of coating compositions used in the filed of electronic technology, silicone-based coating compositions are widely used due to their excellent electrical insulation, heat resistance and stability characeristics. In the manufacture of semiconductor devices, such as VLSIs, for example, silicone-based coating compositions are used as an inter-layer insulation film in the process of multi-layer circuit formation (Japanese patent publication No. 60-46826). Additionally, in the manufacture of liquid crystal display units, such coatings are used to form orientation films (Japanese patent publication No. 60-25851).

When a coating film of a silicone-based coating composition is to be overcoated with another coating film, such as a film of photoresist or a film formed by a CVD or PVD process, good adhesion between the coating films or an improvement of the adhesive bonding strength is desired. In the adhesive bonding during the assembly of liquid crystal display units, the most effective method for obtaining suitable adhesion is to subject the surface of the silicone-based coating film to a treatment with oxygen plasma so as to convert the silicone to silicon oxide. This method, however, is not quite satisfactory from a practical standpoint because cracks are sometimes formed in the coating film.

In Japanese patent Kokai No. 57-111046, a solution has been proposed to this problem, in which the coating film comprises a specific kind of silicone-based coating materials, and a polysilsesquioxane is provided with an overcoating layer of silica ($SiO_2$) or alumina ($Al_2O_3$) in order to improve the adhesiveness of the surface without producing such cracks. This method, however, is also not completely satisfactory because of the relatively high costs involved as a consequence of the additional equipment needed for forming the additional film on the silicone-based coating.

Accordingly, it is desired to develop a method for uniformly improving the surface of a silicone-based coating film without causing crack formation in or exfoliation (i.e., lifting off) of the coating film.

In the manufacture of various kinds of electronic components utilizing such a silicone-based coating film, patterning of the silicone-based coating film on the substrate is usually necessary. In this process, the surface of a silicone-based coating film is coated with a photoresist composition to form a photoresist layer which is then subjected to patterning by conventional photolithographic techniques. Thereafter, the bare, exposed areas of silicone-based coating film are subjected to etching by the RIE method, with the patterned photoresist layer serving as a mask, and followed by the removal of the photoresist layer by a plasma gas treatment using oxygen or a gas mixture mainly composed of oxygen.

This method, however, has a serious problem in that cracks are sometimes formed in the silicone-based coating film during plasma treatment so that it is very difficult to obtain a patterned silicone-based coating film of high quality. This problem can be partly solved by providing an intermediate layer of silica ($SiO_2$) or alumina ($Al_2O_3$) on the coating film, as described in Japanese patent publication No. 57-111046. Such an intermediate layer is effective to relax stress in the film during plasma treatment so that formation of cracks in the silicone-based coating film can be prevented. This method is of course not quite satisfactory from the practical standpoint due to the high equipment and processing costs for the additional coating. Accordingly, it is desired to develop an improved method for patterning a silicone-based coating film without forming cracks during the manufacture of various kinds of electronic components.

SUMMARY OF THE INVENTION

The method of the present invention, which has been developed as a result of the extensive experimentation, comprises treating a coating film of a silicone-based coating composition formed on a semiconductor substrate with a gas plasma mainly composed of oxygen at a sufficient time and temperature (preferably 120° C or below) to effect a surface treatment of the silicone-based coating film by relieving stresses and increasing its adhesive properties without causing cracking or exfoliation of the coating film.

Further, the present invention provides a method for patterning a film of a silicone-based coating composition formed on a substrate which comprises overcoating the silicone-based coating film with a photoresist composition to form a photoresist layer, photolithographically patterning the photoresist layer, selectively removing the silicone-based coating film while the thus patterned photoresist layer serves as a mask and removing the patterned photoresist layer by a plasma treatment with a gas of the type referred to above (i.e. one mainly composed of oxygen at a temperature of 120° C or below).

DETAILED DESCRIPTION OF THE PREFERRED EMBODIMENTS

In practicing the method of the present invention, the surface of a silicone-based coating film or the patterned photoresist layer, after etching of the silicone-based coating film pattern-wise, is subjected to a plasma treatment under specified conditions relating to the gaseous atmosphere, time and the temperature as mentioned herein. The apparatus for such a plasma treatment is not particularly limitative but an induction-type plasma treatment apparatus having a plasma-generating zone and a reaction treatment zone is preferred. The induction-type plasma treatment apparatus is preferably constructed such that the plasma-generating zone and the reaction treatment zone are provided in one chamber so that the plasma treatment can be performed at a lower temperature.

Normally, the temperature in the reaction treatment zone is increased when the time of plasma treatment is extended in any type of plasma treatment equipment. Therefore, the so-called batch-wise plasma treatment apparatus is less preferable in practicing the invention since a plural number of substrates for treatment are simultaneously subjected to the plasma treatment in the apparatus and therefore an increase in the temperature is unavoidable. Instead, an apparatus for leaf-by-leaf plasma treatment is preferred in which the plasma treatment of a substrate follows completion of treatment of the preceding substrate. Batch-wise plasma treatment may be utilized, however, provided that the plasma treatment can be performed at a temperature of 120° C or below.

The silicone-based coating composition used for forming the silicone-based coating film is not particularly limitative provided that the main ingredient thereof is a silicone, i.e., an organopolysiloxane, resin. Preferably, the resin is prepared in the form of a coating solution and the coating film should be formed by baking. The silicone atoms of the silicone resins may either be included in the main chain of the polymeric molecular chain, or they may be included in the pendant groups to the main chain, or they may be included in both.

In particular, suitable silicone-based coating compositions include those coating solutions prepared by dissolving one or more types of silicone-based resins, e.g., polysiloxanes, poly(ladder organosiloxanes), polysilazanes, polysilanes, polysilsilanes, polysilmethylenes, polysilyl phenylenes, poly(phenylene oxy siloxanes), polysilsesquioxanes, poly-(p-trimethylsilyl styrenes), poly(trimethyl vinyl silanes), copolymers of phenyl tripheny siloxy silane diol and bisphenol and the like, in an organic solvent, coating solutions by hydrolyzing an alkoxy silane compound or a halogenated silane compound dissolved in an organic solvent, coating solutions prepared by dissolving a polyimide-silicone resin, which is a reaction product of a diaminopolysiloxane and a mixture composed of an organic diamine and a tetracarboxylic acid, in an organic solvent, and so on. Particularly preferable among the above named ones are the coating solutions containing the hydrolysis products of a alkoxy silane compound or halogenated silane compound in respect of the practical usefulness due to the excellent storage stability thereof.

The organic solvent used in the preparation of the above described coating solutions is exemplified by the alcohols, e.g., methyl, ethyl, propyl and butyl alcohols, ketones, e.g., acetone, methyl ethyl ketone and acetyl acetone, esters, e.g., methyl, ethyl and butyl acetates, polyhydric alcohols and ethers thereof, e.g., ethylene glycol, glycerin, diethylene glycol, ethylene glycol monomethyl ether, ethylene glycol monoethyl ether, ethylene glycol monobutyl ether and propylene glycol and the like. These organic solvents can be used either singly or as a mixture of two or more, as desired.

The method for coating the surface of a substrate with the above described coating solution is not particularly limitative and conventional coating methods such as spinner method, dip-and-pull-up method, spray method, screen printing method, roll coater method, brush coating method and the like are suitable. After its application, the coating layer is dried and then subjected to baking in air or in an atmosphere of an inert gas at 150° C or higher, preferably at 300° C or higher, to form the silicone-based coating film.

When it is desired to improve the surface properties of the thus formed silicone-based coating film, it is subsequently subjected to a treatment with a plasma of a gas mainly composed of oxygen. The content of oxygen in the gaseous mixture of the plasma atmosphere should preferably be at least 80% by volume, the balance being preferably a fluorine-containing gas such as trifluoromethane, perfluoroethane, perfluoropropane, perfluoropentene, perfluorobutene and the like.

The plasma treatment of the silicone-based coating film in the present method should be performed at a temperature no greater than 120° C. When the temperature of the plasma treatment is too high, cracks are sometimes formed in the coating film so that the desired improvement of the surface properties cannot be obtained. Although no lower limit can be applied to the range of the temperature of the plasma treatment, it is practically convenient to perform the plasma treatment at room temperature or higher. A preferable temperature range for the plasma treatment is from about 10° to 100° C. The temperature of plasma treatment implied in this invention is the temperature of the table installed in the plasma chamber for mounting the substrate having the silicone based coating film thereon, rather than the temperature of the plasma gas. This treatment temperature is, therefore, essentially the same as the temperature of the coating and substrate.

The method of the invention for the surface treatment of a silicone-based coating film on a substrate will now be described in greater detail with reference to an example for the manufacture of a multi-layer circuit board.

A patterned circuit wiring layer of a metal such as aluminum is first formed on the surface of a semiconductor substrate for an electronic device and then a silicone-based coating composition is applied to the whole surface by a suitable coating method, followed by drying to form a silicone-based coating film. Thereafter, the silicone-based coating film is subjected to an etching treatment by a conventional photolithographic method to make a contact hole.

The resist layer which has served as a mask in the above mentioned photolithographic method is then removed by a plasma treatment in an atmosphere of a gaseous mixture mainly composed of oxygen. Of course, the surface of the silicone-based coating film is also plasma-treated simultaneously by this procedure. A second vapor deposition of aluminum is performed on the thus plasma-treated silicone-based coating film and an electroconductive circuit wiring layer of a desired pattern is formed by a photolithographic etching treatment in a conventional manner. Finally, a surface-stabilizing layer is formed over the entire surface to complete a multi-layered circuit board.

As mentioned above, the plasma treatment in the present method should be performed in an atmosphere of a gaseous mixture having an oxygen content of at least 80% by volume with the balance being a fluorinated hydrocarbon compound such as trifluoromethane and perfluorinated paraffinic and olefinic compounds (i.e., a volume ratio of from 100:0 to 80:20 oxygen:fluorine-containing gas). The admixture of these fluorine-containing compounds in the gaseous mixture of the plasma atmosphere is effective to increase the speed of resist removal and to decrease the temperature of the plasma treatment. Conversely, an oxygen content in the gaseous mixture of lower than 80% by volume is undesirable because removing the resist layer then requires an increased length of time which consequently increases the temperature in the plasma treatment zone in the plasma chamber so that the desired improvement can often not be obtained due to the formation of cracks in the silicone based coating film.

The time of plasma treatment will vary depending upon the temperature utilized and the type operation to be performed. For the etching or removal of silicone-based coating films having a thickess of between about 0.5 and 2 microms, the time of plasma treatment can vary from about 10 seconds to 3 minutes, depending upon substrate temperature and gas composition. For removal of the photoresist composition, the time and temperature ranges should be slightly lower, but would be in approximately the same ranges given above. The Examples set forth specific preferred times, temperatures and gas compositions to further illustrate the invention.

EXAMPLES

The scope of the invention is further described in connection with the following examples which are set forth for purposes of illustration only and are not to be construed as limiting the scope of invention in any manner.

EXAMPLE 1.

A semiconductor silicon wafer was coated with a coating solution for forming a silicone-based coating film (OCD Type-7 #51R, a product by Tokyo Ohka Kogyo Co., Japan) using a spinner followed by drying and baking in an atmosphere of an inert gas at 400° C for 30 minutes, to form a silicone-based coating film having a thickness of about 1 micron. The silicone-coated silicon wafer was placed in a plasma chamber of an induction-type plasma treatment apparatus (Model TCA-2300 manufactured by Tokyo Ohka Kogyo Co.) and the surface of the silicone-based coating film was subjected to a plasma treatment for 90 seconds by exposure to a plasma generated in the discharge zone and introduced into the reaction treatment zone at a treatment temperature of 60° C. The atmosphere inside the plasma chamber was kept at a pressure of 0.8 Torr by introducing oxygen gas and the electric charge impressed between the electrodes was 250 watts. The silicone-based coating film after this plasma treatment was found to have a uniform surface without cracks.

Thereafter, the plasma-treated silicone-based coating film was coated with a positive-working photoresist composition (OFPR-800, a product of Tokyo Ohka Kogyo Co., Japan) to form a photoresist layer by drying at 110° C for 90 seconds and the photoresist layer was patterned in a conventional photolithographic process. The bare, silicone-based coating film was then subjected to etching with the thus patterned photoresist layer as a mask by exposure to a plasma using a plasma etching apparatus (Model OAPM-400 manufactured by Tokyo Ohka Kogyo Co.) in an atmosphere of a 97:3 by volume gaseous mixture of oxygen and trifluoromethane to find that a patterned silicone-based coating film of high fidelity to the pattern of the original mask was obtained without loss of the photoresist layer from the surface of the silicone-based coating film.

EXAMPLE 2.

The experimental procedure was substantially the same as in Example 1 except that the temperature at which the plasma treatment was performed was 100° C and a coating solution containing a hydrolysis product of a halogenated silane (OCD Type-1, a product by Tokyo Ohka Kogyo Co.) was used for forming a silicone-based coating film. The silicone-based coating film obtained after the plasma treatment was also uniform and free from cracks.

To examine the adhesive bonding strength between the silicone-based coating film and the photoresist layer formed thereon, the silicone-based coating film was subjected to a plasma etching treatment in the same manner as in Example 1. Absolutely no deterioration of the photoresist layer on the silicone-based coating film was found.

EXAMPLE 3. (COMPARATIVE)

The experimental procedure was substantially the same as in Example 1 except that the temperature of the plasma treatment was 150° C. Although the length of time for the plasma treatment was the same as in Example 1, the silicone-based coating film was found to have numerous cracks over its entire surface.

EXAMPLE 4. (COMPARATIVE)

The experimental procedure was substantially the same as in Example 1 except that the mixing ratio of oxygen to trifluoromethane in the gaseous mixture of the plasma atmosphere was 50:50 by volume. No improvement was obtained in adhesive bonding strength between the silicone-based coating film and the photoresist layer formed thereon so that the photoresist layer could not serve as a mask.

EXAMPLE 5. (COMPARATIVE)

A silicone-based coating film was formed on a silicon wafer in the same manner as in Example 1 and the silicon wafer was put in the plasma chamber of a batch-wise plasma treatment apparatus (Model OPM-A1200 manufactured by Tokyo Ohka Kogyo Co.), in which the plasma-generating zone and plasma treatment zone were integrally combined, and subjected to a plasma treatment for 3 minutes by exposing to plasma at a temperature of 250° to 300° C in an atmosphere kept under a pressure of 1.8 Torr by introducing a gaseous mixture composed of 95% by volume of oxygen and 5% by volume of carbon tetrafluoride. Numerous cracks were found in the silicone-based coating film.

EXAMPLE 6.

A semiconductor silicon wafer was coated with a 20% by weight solution of a silicone resin of a ladder polymer type (Glass Resin GR-650, a product by Owens Illinois Co.) in butyl alcohol followed by baking at 200° C for 30 minutes to form a silicone-based coating film. Thereafter, a photoresist layer was formed on the silicone-coated substrate using a positive-working photoresist composition (OFPR-800, identified in Example 1) and the photoresist layer was patterned in a conventional manner. The silicone-based coating layer exposed bare by this patterning of the photoresist layer was subjected to a selective etching treatment by the RIE method.

The thus prepared substrate was placed in the plasma chamber of the same plasma treatment apparatus as used in Example 1 and the patterned photoresist layer was removed by a plasma treatment for 30 seconds at a treatment temperature of 50° C. The electric power supplied to the electrodes was 250 watts and the atmosphere was kept under a pressure of 0.8 Torr by introducing a gaseous mixture composed of 95% by volume of oxygen and 5% by volume of trifluoromethane. The removal of the photoresist layer was complete and left a uniformly patterned silicone-based coating film which was absolutely free from cracks.

EXAMPLE 7.

The experimental procedure was substantially the same as in the preceding example, except that the silicone-based coating solution was prepared by diluting 40 g of a silicone varnish (KR-285, a product by Shin-Etsu Chemical Co., Japan) with 60 g of ethyl alcohol. A uniformly patterned silicone-based coating layer was obtained absolutely without cracks.

EXAMPLE 8. (COMPARATIVE)

The experimental procedure was substantially the same as in Example 7 except that the apparatus for the plasma treatment was the same batch-wise apparatus as used in Comparative Example 5 and the temperature for the plasma treatment was 150 to 200° C. Although removal of the patterned photoresist layer was complete, a large number of cracks were found in the patterned silicone-based coating film which partly lifted off the surface of the substrate.

EXAMPLE 9. (COMPARATIVE)

A silicon wafer, after selective etching of the silicone-based coating film in the same manner as in Example 7, was subjected to a plasma treatment for removing the patterned photoresist layer. The plasma treatment apparatus was of the leaf- by-leaf type (Model OPM-EM800 manufactured by Tokyo Ohka Kogyo Co.). The electric power supply was 500 watts and the treatment temperature was 200° C. The plasma was kept under a pressure of 1.2 Torr by introducing oxygen. A large number of cracks were found in the silicone based coating film although removal of the patterned photoresist layer was complete.

While it is apparent that the invention herein disclosed is well calculated to fulfill the objects above stated, it will be appreciated that numerous modifications and embodiments may be devised by those skilled in the art, and it is intended that the appended claims cover all such modifications and embodiments as fall within the true spirit and scope of the present invention.

What is claimed is:

1. A method for the treatment of a silicone-based coating film on a substrate which comprises:
    applying a silicone-based coating solution containing a hydrolysis product of an alkoxy silane or a halogenated silane onto a surface of a semiconductor substrate to form a silicone-based coating film thereupon;
    holding a plurality of said silicone-based coating films and semi-conductor substrates in a reaction treatment zone of a plasma chamber of a plasma treatment apparatus, the plasma chamber being composed of a plasma-generating zone and a reaction treatment zone, wherein the plasma-generating zone is positioned upon or above the reaction treatment zone but adjacent thereto;
    introducing a gas composed of a mixture of oxygen and at least one fluorine-containing gas wherein the mixture contains at least 80% by volume of oxygen into the plasma chamber;
    generating plasma in the plasma-generating zone;
    conducting the plasma generated in the plasma-generating zone into the reaction treatment zone; and
    exposing the surfaces of the silicone-based coating films to the plasma introduced into the reaction treatment zone for a time sufficient to improve the surface properties and adhesive properties of the coating films without causing cracking or exfoliation thereof while maintaining the temperature of the silicone-based coating film and substrate below about 120° C; wherein a plural number of the substrates are treated in series.

2. The method of claim 1 wherein the temperature of silicone-based coating film and substrate is maintained between about 50° and 100° C.

3. The method of claim 1 wherein the hydrolysis product of the silicone-based coating solution is a halogenated silane.

4. The method of claim 1 wherein the mixture contains 95% or less of oxygen and 5% or more of said fluorine containing gas.

5. An improved method for patterning a silicone-based coating film on a semiconductor substrate by selective etching thereof with a patterned photoresist layer thereon as a mask followed by removal of the photoresist layer by a plasma treatment which comprises the steps of:
    applying a silicone-based coating solution containing a hydrolysis product of an alkoxy silane or a halogenated silane onto a surface of a semiconductor substrate to form a silicone-based coating film thereupon;
    applying a photoresist image upon said silicone-based coating film and semiconductor substrate in the form of a pattern;
    holding a plurality of said patterned, photoresist imaged silicone based coating films and semiconductor substrates in a reaction treatment zone of a plasma chamber of a plasma treatment apparatus, the plasma chamber being composed of a plasma-generating zone and a reaction treatment zone wherein the plasma-generating zone is positioned upon or above the reaction treatment zone but adjacent thereto;
    introducing a gas composed of a mixture of oxygen and at least one fluorine-containing gas wherein the mixture contains at least 80% by volume of oxygen into the plasma chamber;
    generating plasma in the plasma-generating zone;
    conducting the plasma generated in the plasma-generating zone into the reaction treatment zone; and
    exposing the surface of the patterned photoresist masked silicone-based coating film to the plasma introduced into the reaction treatment zone for a time sufficient to remove said patterned photoresist and to improve the surface properties and adhesive properties of the coating film without causing cracking or exfoliation thereof while maintaining the temperature of the silicone-based coating film and substrate below about 120° C; wherein a plural number of the substrates are treated in series.

6. The method of claim 5 wherein the temperature of the silicone-based coating film and substrate is maintained between about 50° and 100° C.

7. The method of claim 5 wherein the photoresist material is a positive working photoresist composition.

8. The method of claim 5 wherein the fluorine containing gas is a fluorinated hydrocarbon.

9. The method of claim 5 wherein the hydrolysis product of the silicone-based coating solution is a halogenated silane.

10. The method of claim 5 wherein the mixture contains 95% or less of oxygen and 5% or more of said fluorine containing gas.

* * * * *